United States Patent
Demuth et al.

(10) Patent No.: US 9,005,421 B2
(45) Date of Patent: Apr. 14, 2015

(54) SILICIDES FOR PHOTOELECTROCHEMICAL WATER SPLITTING AND/OR THE PRODUCTION OF ELECTRICITY

(75) Inventors: Martin Demuth, Mülheim an der Ruhr (DE); Klaus Kerpen, Mülheim an der Ruhr (DE); Andrij Kuklya, Mülheim an der Ruhr (DE)

(73) Assignee: H2 Solar GmbH, Lörrach (DE)

( * ) Notice: Subject to any disclaimer, the term of this patent is extended or adjusted under 35 U.S.C. 154(b) by 443 days.

(21) Appl. No.: 13/124,396

(22) PCT Filed: Oct. 14, 2009

(86) PCT No.: PCT/DE2009/001428
§ 371 (c)(1),
(2), (4) Date: Jul. 11, 2011

(87) PCT Pub. No.: WO2010/043208
PCT Pub. Date: Apr. 22, 2010

(65) Prior Publication Data
US 2011/0303548 A1 Dec. 15, 2011

(30) Foreign Application Priority Data
Oct. 15, 2008 (DE) ......................... 10 2008 051 670

(51) Int. Cl.
| | | |
|---|---|---|
| C25B 1/00 | (2006.01) |
| H01L 31/032 | (2006.01) |
| H01L 31/0328 | (2006.01) |
| H01L 31/068 | (2012.01) |
| H01L 31/07 | (2012.01) |
| H01L 31/072 | (2012.01) |
| C01B 3/04 | (2006.01) |
| C01B 13/02 | (2006.01) |
| H01G 9/20 | (2006.01) |

(52) U.S. Cl.
CPC .............. *C25B 1/003* (2013.01); *H01G 9/2045* (2013.01); *H01L 31/032* (2013.01); *H01L 31/0328* (2013.01); *H01L 31/068* (2013.01); *H01L 31/07* (2013.01); *H01L 31/072* (2013.01); *Y02E 10/542* (2013.01); *Y02E 60/368* (2013.01); *C01B 3/042* (2013.01); *C01B 13/0207* (2013.01); *Y02E 60/364* (2013.01); *Y02E 10/547* (2013.01)

(58) Field of Classification Search
CPC .. C01B 13/0207; C01B 3/042; C01B 13/207; Y02E 60/368; Y02E 60/364; C25B 1/003
USPC ..................... 205/340; 204/157.52
See application file for complete search history.

(56) References Cited

U.S. PATENT DOCUMENTS

| | | | | |
|---|---|---|---|---|
| 3,297,487 A | * | 1/1967 | Pomeroy et al. | 429/487 |
| 3,669,751 A | * | 6/1972 | Richman | 429/414 |
| 4,461,691 A | * | 7/1984 | Frank | 205/340 |
| 4,492,743 A | * | 1/1985 | Howe | 429/111 |
| 4,521,800 A | * | 6/1985 | Howe | 429/111 |
| 4,525,436 A | * | 6/1985 | Yamazaki | 205/340 |
| 4,528,252 A | * | 7/1985 | Yamazaki | 205/340 |
| 4,534,099 A | | 8/1985 | Howe | |
| 4,656,103 A | * | 4/1987 | Reichman et al. | 205/340 |
| 4,786,851 A | * | 11/1988 | Fuji et al. | 136/258 |
| 5,140,397 A | * | 8/1992 | Haga et al. | 136/258 |
| 5,151,385 A | * | 9/1992 | Yamamoto et al. | 136/256 |
| 5,785,768 A | * | 7/1998 | Nakata | 136/250 |
| 5,942,048 A | * | 8/1999 | Fujisaki et al. | 136/256 |
| 6,090,505 A | * | 7/2000 | Shimamura et al. | 429/218.1 |
| 6,203,985 B1 | * | 3/2001 | Jiang et al. | 205/340 |
| 8,105,469 B2 | * | 1/2012 | Whitehead et al. | 204/290.03 |
| 2006/0243587 A1 | | 11/2006 | Tulloch | |
| 2008/0113271 A1 | * | 5/2008 | Ueda et al. | 429/231.95 |
| 2008/0292536 A1 | * | 11/2008 | Demuth et al. | 204/157.52 |
| 2009/0313886 A1 | * | 12/2009 | Hinman et al. | 422/186.3 |
| 2010/0000874 A1 | * | 1/2010 | Hinman et al. | 205/340 |
| 2012/0201734 A1 | * | 8/2012 | Lefenfeld et al. | 423/344 |

FOREIGN PATENT DOCUMENTS

| | | |
|---|---|---|
| DE | 10210465 A1 * | 10/2003 |
| DE | 1022504025 A1 * | 3/2007 |
| JP | 08088394 A * | 4/1996 |

(Continued)

OTHER PUBLICATIONS

Li et al, "Significant effect of pressure on the H2 releasing from photothermal-catalytic water steam splitting over TiSi2 and Pt/TiO2," Catal. Lett. (2008) 125:376-379.*

Fan et al, "Semiconductor Electrodes. LIV. Effect of Redox Couple, Doping Level, and Metal Type on the Electrochemical and Photoelectrochemical Behavior of Silicide-Coated n-Type Silicon Photoelectrodes," J. Electrochem. Soc., Apr. 1984, pp. 828-833.*

T. Tsukada, K. Seki, H. Yamamoto and A. Sasano (1984). Semitransparent Silicide Electrode Formed on the Surface of a-Si:H. MRS Proceedings, 33, 301 doi:10.1557/PROC-33-301.*

(Continued)

*Primary Examiner* — Colleen M Raphael
(74) *Attorney, Agent, or Firm* — Gudrun E. Huckett

(57) ABSTRACT

The invention relates to a method for the photoelectrochemical production of hydrogen and oxygen and for the simultaneously or separately conducted photoelectrical/photovoltaic production of electricity, characterized in that water is brought into contact with silicides, while applying light at the same time, or the contact with water can be foregone if electricity is produced exclusively. The invention enables the production of hydrogen and oxygen in a simple way directly from water, wherein the use of UV light and cost-intensive catalysts can be foregone.

14 Claims, No Drawings

(56) References Cited

FOREIGN PATENT DOCUMENTS

JP       2004266023 A1    9/2004
WO    WO 2007036274 A2 *  4/2007    ............... C01B 3/04

OTHER PUBLICATIONS

Machine translation of DE 10210465A1.*
Hope G A et al: Semiconductor Electrodes. 52. Photoelectron Spectroscopic Determination of the Structure of Thin Platinum Silicide Layers Formed on Si(100) and Si)111) for Use as Electrodes; J. Electrochem. Soc., vol. 130, No. 7, Jul. 1983; pp. 1488-1491 (see attached international search report).
Maier C U et al: "Hydrogen evolution on platinum-coated p-silicon photocathodes", International Journal of Hydrogen Energy; Elsevier Science Publishers B.V. Barking, GB, vol. 21, No. 10; Oct. 1, 1996, pp. 859-864 (see attached international search report).
F.-R. F Fan et al: "Semiconductor Electrode. 48. Photooxidation of Halides and Water on n-Silicon Protected with Silicide Layers"; J. Am. Chem. Soc., vol. 105, No. 2, Feb. 1983, pp. 220-224 (see attached international search report).

* cited by examiner

SILICIDES FOR PHOTOELECTROCHEMICAL WATER SPLITTING AND/OR THE PRODUCTION OF ELECTRICITY

The present invention relates to a process for the photoelectrochemical production of hydrogen and oxygen from water and of electricity, this in the presence of silicides (silicides) in general and especially in presence of metal silicides and nonmetallic silicides, such as borosilicides, carbon-containing silicides and nitrogen-containing silicides, i.e., compounds containing silicon and having the composition $RSi_x$. R represents in this connection an organic, metallic, organometallic, non-metallic or inorganic residue and Si stands for the element silicon (silicon) with an increasing number of atoms X>0. In the following text, these classes of substances are named silicides. The silicide subunits of these substances are characterized by enhanced electron density. The silicides in the aforementioned processes catalytically active wherein these processes can occur with or without light. However, when illuminated, using artificial light and sunlight, an increase of gas evolution is observed. Higher reaction temperatures are often accelerating the reaction. Silicides are mostly semiconductor materials.

The silicides are used as electrode materials (alternatively as anode or cathode), coupled with a counter electrode (e.g., a metal, a metal oxide or another conducting material and/or as a light-harvesting material as a part of a photoelectronic/electrical process. In this way, they can be employed as part of a photovoltaic system. The silicides serve to (a) produce hydrogen and oxygen from water in the presence of light and (b) to also simultaneously or separately produce electricity (electrical energy). In case of (b), liquid and/or non-liquid electrolytes are employed and for the purely photovoltaic application, with suitable doping of the electrodes, electrolytes can be eliminated entirely.

Furthermore, it was found that coupling or complexing of a dye, such as perylenes or analogs thereof, to the silicides is favorable for the light absorption of these substances as well as the charge separation and hence the reactivity of the silicides.

Further, it was found that reactions with silicides for splitting water into hydrogen and oxygen in presence of light for the purpose of generating hydrogen and oxygen but also for generating electricity can be performed also with immobilized silicides, i.e., with silicides which are located on or in polymeric materials and/or on or in glasses or glass-like materials as well as on or in electrically/electronically conducting materials. This applies also to the photovoltaic application of the silicides. The process of the invention delivers aside from hydrogen and oxygen also electricity, i.e., electric energy.

BACKGROUND

For carrying out photochemical reactions to produce hydrogen and oxygen from water with metallic catalysts, several processes have been disclosed. These are lanthanide-like photcatalysts such as, for example, $NaTaO_3$:La, catalysts from rare earth metals, such as $R_2Ti_2O_7$ (R=Y, rare earth metal), or $TiO_2$-derived semiconductor systems, so-called tandem cells, wherein up to now no use of silicides has been disclosed for the application according to the title.

The processes for production of hydrogen and oxygen from water are based on reduction and/or oxidation of water with semiconductor materials and light. Such processes are also named water splitting processes. The hitherto disclosed processes use UV light. Although in some cases an appreciable development of hydrogen and oxygen has been found, the required illumination conditions are not suitable for solar-based application of the process. In addition, the production of the catalysts is laborious and requires the use of uneconomically high temperatures, starting from expensive basic materials of extremely high purity. Furthermore, for performing the aforementioned processes the use of very pure (triple distilled) water is required. In most cases there is no mention with respect to long-term applicability and the related stability of the catalysts.

The only promising approach so far employs silicide powder wherein the semiconductor itself splits the water into hydrogen and oxygen gas in presence of light. Oxygen has to be separately removed from the system. All these systems can be used only to split water and not for simultaneously or separately occurring production of electric power (photovoltaic principle).

Silicides have so far not been used for the configuration of photovoltaic systems. Only in individual cases (i.e., $IrSi_2$ and beta-$FeSi_2$) electrical and optical properties of films were measured.

DESCRIPTION OF THE INVENTION

Surprisingly, it has now been found that these disadvantages can be avoided when using silicides (silicides), i.e. metal silicides and non-metallic silicides such as borosilicides, carbon-containing silicides and nitrogen-containing silicides, i.e., compounds that contain silicon and have the composition $RSi_x$, when these processes are carried out according to a photoelectric principle, i.e., when the silicides are used as light absorbers and/or electrode. R can be an organic, metallic, organometallic or inorganic moiety and Si stands for the element silicon (silicon) with an increasing number of atoms X>0. In the following text these classes of substances are named silicides. The silicide subunits of these compounds are characterized by an enhanced electron density, i.e., a negative charge density, or they have a negative charge.

Non-metallic silicides such as borosilicides, carbon-containing silicides and nitrogen-containing silicides are also called silicon borides, silicon carbides and silicon nitrides, respectively.

Examples of silicides, metal silicides and non-metallic silicides, such as borosilicides, carbon-containing silicides and nitrogen-containing silicides are nickel silicide ($Ni_2Si$), iron silicide ($FeSi_2$, FeSi), thallium silicide ($ThSi_2$), borosilicide, also called silicon tetraboride ($B_4Si$), cobalt silicide ($CoSi_2$), platinum silicide (PtSi, $Pt_2Si$), manganese silicide ($MnSi_2$), titanium carbon silicide ($Ti_3C_2Si$), carbon silicide/polycarbon silicide or also named silicon carbide/poly-silicon carbide (CSi/poly-CSi or SiC/poly-SiC), iridium silicide ($IrSi_2$), zirconium silicide ($ZrSi_2$), tantalum silicide ($TaSi_2$), vanadium silicide ($V_2Si$), chromium silicide ($CrSi_2$), beryllium silicide ($Be_2Si$), magnesium silicide ($Mg_2Si$), calcium silicide ($Ca_2Si$), strontium silicide ($Sr_2Si$), barium silicide ($Ba_2Si$), aluminum silicide (AlSi), gallium silicide (GaSi), indium silicide (InSi), hafnium silicide (HfSi), rhenium silicide (ReSi), niobium silicide (NbSi), germanium silicide (GeSi), tin silicide (SnSi), lead silicide (PbSi), arsenic silicide (AsSi), antimony silicide (SbSi), bismuth silicide (BiSi), molybdenum silicide (MoSi), tungsten silicide (WSi), ruthenium silicide (RuSi), osmium silicide (OsSi), rhodium silicide (RhSi), palladium silicide (PdSi), copper silicide (CuSi), silver silicide (AgSi), gold silicide (AuSi), zinc silicide (ZnSi), cadmium silicide (CdSi), mercury silicide (HgSi), scandium silicide (ScSi), yttrium silicide (YSi), lanthanum silicide (LaSi), cerium silicide (CeSi), praseodymium silicide (PrSi), neodymium silicide (NdSi), samarium silicide (SmSi), europium silicide (EuSi), gadolinium silicide (GdSi), terbium silicide (TbSi), dysprosium silicide (DySi), erbium silicide (ErSi), thulium silicide (TmSi), ytterbium silicide (YbSi), lutetium silicide (LuSi), copper-phosphorus silicide ($CuP_3Si_2$, $CuP_3Si_4$), cobalt-phosphorus silicide ($Co_5P_3Si_2$, $CoP_3Si_3$) iron-phosphorus silicide ($Fe_2PSi$, $FeP_4Si_4$, $Fe_{20}P_9Si$), nickel-phosphorus silicide ($Ni_2PSi$, $Ni_3P_6Si_2$ $NiP_4Si_3$, $Ni_5P_3Si_2$), chromium-phosphorus silicide ($Cr_{25}P_8Si_7$), molybdenum-phosphorus silicide (MoPSi), tungsten-phosphorus silicide (WPSi), titanium phosphorus silicide (TIPSi), cobalt-boron silicide ($Co_5BSi_2$), iron-boron silicide ($Fe_5B_2Si$), nickel-boron silicide ($Ni_4BSi_2$, $Ni_6BSi_2$, $Ni_9B_2Si_4$), chromium-boron silicide ($Cr_5BSi_3$), molybdenum-boron silicide ($Mo_5B_2Si$), tungsten-boron silicide ($W_2BSi$), titanium-boron silicide (TiBSi), chromium-arsenic silicide (CrAsSi), tantalum-arsenic silicide (TaSiAs), titanium-arsenic silicide (TiAsSi) or mixtures thereof. Notably, the elemental compositions given in parentheses (empirical formulas) are exemplary only and the ratios of the elements relative to each other are variable.

Silicides are abundant and easily accessible materials (mostly semiconductor materials) and so far have not been applied for the applications according to the title in photoelectrochemical as well as photovoltaic application.

Silicides are mainly semiconductor-like materials with high electron densities (negative charge densities) at the silicon, carbon, nitrogen and boron. The claimed processes for the production of hydrogen and/or oxygen by means of silicides proceed efficiently with light. The employed light energy can be in this connection artificial or solar-generated (emission range: 200-15,000 nm) and can be of diffuse or concentrated nature. The thermal energy which accompanies photonic energy of a light source or also thermal energy in general can accelerate the gas-producing claimed processes. In general terms, the application of higher temperatures as well as higher light concentrations can lead to a higher efficiency of the claimed processes. This applies not only to water splitting into hydrogen and oxygen but also to the production of electricity via photovoltaics, i.e., electric energy, which can proceed jointly or separately with water splitting.

The silicides are applied as electrode materials (alternatively as cathode or anode) in these photoelectrochemical and photovoltaic processes and are coupled to one or several counter electrode(s) (alternatively as anode(s) or cathode(s)) in an electrically conducting manner. The counter electrodes have to be of metallic or non-metallic but electrically conducting nature. In this arrangement an electrolyte is used between the electrodes. For the purely photovoltaic application of the silicides, with suitable p-/n-doping of the electrode materials the presence of an electrolyte is not necessary and the electrodes can be brought in direct contact.

When used as part of a photovoltaic device undoped or doped silicides (see doping examples below) are used that are brought into electrically conducting contact. In this connection, also other photoelectrically/photovoltaically active materials can be employed; this also external to the system as a light absorber.

The silicides absorb themselves usually enough solar or artificial radiation energy without requiring larger surface modifications in order to effect splitting of water for generating hydrogen and oxygen or for simultaneously or separately occurring generation of electricity (photovoltaics).

Surprisingly, it was found also that the quality and purity of the employed water is not important or can be neglected for carrying out the processes according to the title, i.e., relative to the oxidation and reduction of water and/or the simultaneously or separately occurring generation of electricity (photovoltaics).

The reactivity of the silicides with respect to water splitting claimed in this application for generation of hydrogen and oxygen and/or the simultaneously or separately occurring generation of electricity (photovoltaics) is primarily of a catalytic nature.

Further, it was found that the processes that are performed with the silicides for water splitting to produce hydrogen and oxygen and/or simultaneous or separate generation of electricity (photovoltaics) can also be conducted with silicides in immobilized form, i.e. the processes can also be performed with compounds that are bound/fixed on or in polymeric surfaces or materials as well as on or in glasses or glass-lice materials as well as on or in other solid surfaces or also on nano particles, and especially also when these materials are electrically conducting, i.e., are charge-conducting. Further, the silicides can be existing as a solid composite, preferentially crystalline, but can also be of amorphous constitution.

The processes described above can be conducted at higher or lower temperatures than room temperature and high as well as low light intensities.

In case of the production of electricity, it is also possible to eliminate the use of an aqueous/liquid electrolyte and instead a viscous, solid and/or gel-type electrolyte can be used. In case of suitable p-/n-doping of the electrodes, the electrolyte can also be eliminated and the electrodes can be brought into direct contact.

Further, it was found that coupling/complexing/attaching/bonding of a dye or an agglomeration of dyes on silicides is favourable for the light absorption and charge separation and, in turn, for the reactivity of these compounds (so-called dye-sensitized reactions with semiconductors). Especially suited for this purpose are dyes such as perylenes and analogs thereof. These dye-complexed silicides can also be used in thermally conducted reactions, even at higher temperatures, because perylene dyes are thermally stable.

The higher temperatures mentioned above can be achieved electrically, by geothermal energy, light energy, solar energy, heating devices, microwave discharge or any other source of thermal energy.

Further, it was found that the silicides can be used for the applications according to the title individually or in combination of two or more silicides. It is also possible to carry out the title processes with one or more silicide(s) together with application of additional semiconductor materials that are not of silicide-type structure such as e.g. ruthenium dioxide ($RuO_2$), manganese dioxide ($MnO_2$), tungsten trioxide ($WO_3$) and generally other semiconductor material in order to assist/enhance the processes according to the title.

Furthermore, it was found that the processes according to the title can be enhanced that are with silicides doped/combined/alloyed with lithium, sodium, magnesium, potassium, calcium, aluminum, boron, carbon, nitrogen, silicon, titanium, vanadium, zirconium, yttrium, lanthanum, nickel, manganese, cobalt, gallium, germanium, phosphorus, cadmium, arsenic, technetium, alfa-SiH and the lanthanides up to 50 percent by weight (relative to the silicides and the silicide-type compounds). As dopant (p- and n-doping) generally the elements usually applied in photovoltaics are conceivable that have a chemical valance that is different from the surrounding material.

This new technology, based on the applications of silicides described above, can be employed in the following fields: New heating systems, fuel cell technology and/or production of electricity in general. There will be also applications in terrestrial and extra-terrestrial area for moving as well as static constructions and devices; this to replace, support or supplement these constructions and devices that up to now are driven by devices that utilize conventional fossil energy sources.

EXAMPLES

Example 1

Crystalline titanium disilicide ($TiSi_2$) in solid form ("sputtering target", 5 cm in diameter) is placed into a vessel (cylindrical shape and coolable and with free gas space, reaction temperature: 25-30° C.) and electrically connected with a counter electrode (e.g., $IrO_2$ or $RuO_2$).

A membrane, e.g. of nafion or Teflon that is permeable for hydrogen and oxygen is placed between the electrodes. An electrolyte is added to the water phase (e.g., acidified with sulphuric acid to pH 2) and irradiation is done along the longitudinal axis of the cylindrical apparatus (white light, 500-1,000 W or sunlight); the silicide is irradiated in doing so. The gas analyses are conducted by gas chromatography. The employed water used can be purified by ion exchange material; but normal water can be used also. The silicide in this arrangement serves as a cathode (hydrogen generation) and the transition metal oxides as anode (generation of oxygen). An appreciable electrical current can be measured in addition.

Example 2

Instead of the silicides mentioned in example 1, other silicides were employed such as cobalt silicide ($CoSi_2$), platinum silicides (PtSi, $Pt_2Si$), titanium carbosilicide ($Ti_3C_2Si$), carbosilicide/poly-carbosilicide (also named silicon carbide/polysilicon carbide (CSi/poly-CSi or SiC/poly-SiC)), zirconium silicide ($ZrSi_2$), or chromium silicide ($CrSi_2$). The reactions were carried out in analogy to example 1. In principle any silicide is suitable in this application.

Example 3

Same experimental set-up as in example 1, but titanium disilicide ($TiSi_2$) serves as anode and platinum as counter electrode (cathode). Less oxygen and hydrogen are formed but a higher electrical current is measured that can be used for example for drives and other energy-dependent systems.

Example 4

If in the processes described in experiments 1 and 2, TiSi is employed as cathode material, no gas evolution is observed but a significant electrical current is measured.

Example 5

Example 4 can also be conducted without water contact. In this connection, instead of the aqueous sulphuric acid as electrolyte, an electrolyte gel has to be used between the electrodes as a contact.

Example 6

When in the processes described in experiments 1 and 2, higher reaction temperatures are applied (45-100° C.), a more vigorous gas evolution is observed. Practically, such temperatures can be reached upon use of flat-bed solar reactors and sunlight as a radiation source.

Example 7

A perylene such as N,N'-bis-phenyl-ethyl-perylene-3,4,9,10-tetracarboxyl-diimide (2 g) which is soluble in chloroform (but not in water), is dissolved (in chloroform, 5 ml), 5 g of titanium silicide ($TiSi_2$ or $Ti_5Si_3$) are added, and the shiny stirred and irradiated (see example 1) at room temperature for 2 hours.

After removal of the solvent in vacuum the residue is used for further reaction according to the conditions as described in example 1. A higher hydrogen and oxygen development was measured in this connection.

Example 8

As an alternative to the reaction conditions that have been described in connection with examples 1 and 2, flat-bed solar reactors or a sunlight concentrator system (parabolic troughs or Fresnel optics) can be used.

Heating of the silicide to, for example, 200° C. under these conditions is no problem for the success of the reaction according to the title and even process-promoting. This applies also to the use of concentrated light energy.

Example 9

The silicide (e.g., $TiSi_2$) was provided with (doped) according to standard techniques with Pt and a reaction carried out in analogy to example 1. A higher gas yield and higher electrical current compared to example 1 were measured.

Example 10

Both water splitting for generating hydrogen and oxygen as well as the production of electricity is achieved upon external use of a silicide (e.g., as a plate) electrically connected to the platinum electrode and a transition metal electrode as a counter electrode. In this connection, the electrode spaces can be separated for water splitting by a membrane (nation or Teflon) and an electrolyte, as mentioned in example 1, can be used

Example 11

For the production of electricity (photovoltaics) water contact can also be eliminated and an electrolyte-gel in analogy to example 5 is used between the electrodes.

Example 12

Carried out as in example 11, but with several electrodes in series (connected electrically) and provided with an electrolyte (as in examples 5 and 11) As electrodes TiSi/beta-$FeSi_2$/$RuO_2$)alfa-$FeSi_2$) were employed.

Example 13

Upon suitable p-/n-doping of the electrodes the use of an electrolyte is not necessary and the electrodes can be brought into direct contact upon electrical connection. For p-doping aluminum on $TiSi_2$ and for n-doping phosphorus on TiSi were chosen and the two layers were brought into contact. A considerable electrical current was measured. It is also possible to bring several layers into contact wherein a significantly higher current flow was measured when this arrangement was exposed to artificial light as well as solar radiation.

What is claimed is:

1. A process for generating hydrogen and oxygen from water, comprising the step of bringing water into contact with at least one crystalline silicide under simultaneous application of light, wherein the at least one silicide is an electrode that is in electric contact with at least one counter electrode by an electrolyte, wherein the counter electrode can be a metal, a transition metal, a metal oxide, a transition metal oxide, a non-metallic structure and/or a mixed structure, wherein the at least one silicide belongs to non-metallic silicides, such as boron silicide, also called silicon tetraboride ($B_4Si$), compounds that contain silicon and correspond to the molecular formula $RSi_x$ where R represents an organic, organometallic and/or inorganic residue or a mixture thereof and Si stands for the element silicon (silicon), with an increasing number of atoms X>0.

2. Process according to claim 1, wherein the at least one silicide contains at least one silicon atom with increased electron density (negative charge density).

3. Process according to claim 1, wherein the at least one silicide can serve as catalyst and absorber of artificial as well as solar light as well as a thermal part of the artificial and/or solar radiation in a photoelectrochemical process of water splitting.

4. Process according to claim 1, wherein the at least one silicide includes a silicide as a light absorber positioned outside of the photoelectrochemical device for the production of hydrogen and oxygen from water.

5. Process according to claim 1, wherein the photochemical reaction for the production of hydrogen and oxygen from water is performed in the presence of the at least one silicide acting as a light absorbing material and the process is driven by artificial light and/or sunlight in concentrated and/or diffuse form.

6. Process according to claim 1, wherein a light source and/or additional thermal energy sources emit radiation energy in the range of 200-15,000 nm.

7. Process according to claim 1, wherein a light absorption of the at least one silicide is enhanced in that a dye or an agglomeration of dyes is coupled/complexed/attached/bound to the at least one silicide.

8. Process according to claim 1, wherein dyes are employed and the dyes are perylenes and perylene analogs.

9. Process according to claim 1, wherein higher reaction temperatures and/or artificial and/or solar light concentration and/or light intensity have an advantageous effect on the course of the process.

10. Processes according to claim 1, wherein an introduced additional thermal energy for production of hydrogen and oxygen from water originates from a photochemical light source, from artificial or solar light sources and/or other devices that produce thermal energy such as electrical heating systems, microwave systems, and/or geothermal energy and/or other energy sources.

11. Process according to claim 1, wherein the at least one silicide can be supported in their reactivity by other semiconductor materials that do not have a silicide structure, such as ruthenium dioxide ($RuO_2$), manganese dioxide ($MnO_2$), tungsten trioxide ($WO_3$), iridium oxide ($IrO_2$), rhodium oxide ($RhO_2$) as well as other semiconducting materials, in order to actively support the processes of all of the preceding claims.

12. Process according to claim 1, wherein the at least one silicide can be employed in immobilized form, i.e., embedded in polymeric materials (such as polyamide, macrolon or plexiglass), surfaces, glasses or glass-like materials or are attached/fixed to polymeric materials, surfaces, glasses or glass-like materials, and this especially when the polymeric and/or glass-like materials are electrically or electronically or charge conducting.

13. Process according to claim 1, wherein the at least one silicide is used after surface treatment with a polymeric material (such as polyamide, macrolon or plexiglass) or glass or a glass-like material, and this especially when the polymeric and/or glass-like materials are electrically or electronically or charge conducting.

14. Process according to claim 1, wherein the at least one silicide and the at least one counter electrode are brought into contact, are doped/alloyed with lithium, sodium, magnesium, potassium, calcium, aluminium, boron, carbon, silicon, titanium, vanadium, zirconium, yttrium, lanthanum, nickel, manganese, cobalt, gallium, germanium, indium, arsenic, phosphorus, the lanthanides or other p- or n-dopant atoms conventional in photovoltaics, this in elemental and/or ionic/radical form of the elements and this up to 50 percent by weight relative to the silicides and the counter electrode materials.

\* \* \* \* \*